United States Patent
Hosoi et al.

(10) Patent No.: US 9,426,887 B2
(45) Date of Patent: Aug. 23, 2016

(54) WIRING BOARD AND ELECTRONIC DEVICE USING THE SAME

(71) Applicant: KYOCERA SLC Technologies Corporation, Yasu-shi, Shiga (JP)

(72) Inventors: Yoshihiro Hosoi, Kirishima (JP); Takayuki Taguchi, Hikone (JP); Hidetoshi Yugawa, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/927,554

(22) Filed: Jun. 26, 2013

(65) Prior Publication Data

US 2014/0000946 A1    Jan. 2, 2014

(30) Foreign Application Priority Data

Jun. 29, 2012  (JP) ................. 2012-146364

(51) Int. Cl.
*H05K 7/10* (2006.01)
*H05K 7/12* (2006.01)
*H05K 1/11* (2006.01)
*H05K 3/46* (2006.01)

(52) U.S. Cl.
CPC ............... *H05K 1/115* (2013.01); *H05K 1/113* (2013.01); *H05K 3/4602* (2013.01); *H05K 2201/099* (2013.01); *H05K 2201/09436* (2013.01); *H05K 2201/09736* (2013.01); *H05K 2201/1034* (2013.01); *H05K 2201/10674* (2013.01)

(58) Field of Classification Search
USPC ................... 361/767; 257/E21.512, E21.507; 174/257
See application file for complete search history.

(56) References Cited

U.S. PATENT DOCUMENTS

2008/0206926 A1* 8/2008 Sakamoto et al. ............ 438/110

FOREIGN PATENT DOCUMENTS

JP    2009-141229 A    6/2009

* cited by examiner

*Primary Examiner* — Andargie M Aychillhum
(74) *Attorney, Agent, or Firm* — Procopio Cory Hargreaves and Savitch LLP (57) ABSTRACT

A wiring board according to the present invention includes an insulating board; a first pad provided inwardly from a surface of the insulating board and electrically connected to an electrode of an electronic component; a second pad provided on the surface of the insulating board and electrically connected to a lead terminal. The first pad and the second pad include a first layer region made of copper and a second layer region arranged on the first layer region and made of nickel, and a thickness of the second layer region of the second pad is larger than a thickness of the second layer region of the first pad.

8 Claims, 5 Drawing Sheets

WIRING BOARD AND ELECTRONIC DEVICE USING THE SAME

BACKGROUND OF THE INVENTION

1. Field of the Invention

The present invention relates to a wiring board and an electronic device using the same which are used in electronic apparatuses such as various types of audio visual devices, household electric appliances, communication devices, computer devices, inspection devices, and peripheral devices thereof.

2. Description of Related Art

Conventionally, an electronic device in which an electronic component is mounted on a wiring board, and the wiring board is connected to an external circuit is used in electronic apparatuses and the like.

Japanese Unexamined Patent Application Publication No. 2009-141229 describes a wiring board provided with an insulating board (relay board), a first pad (chip connection terminal) to which an electrode of an electronic component (semiconductor chip) is electrically connected by wire bonding, and a second pad (outer lead connection terminal) to which a lead terminal (outer lead) is electrically connected through solder.

Incidentally, for example, when a lead terminal is connected to a wiring board, the lead terminal is bent in some cases. When the lead terminal is bent, bending stress applied to the lead terminal reaches the wiring board through the second pad, and the wiring board becomes susceptible to bending. When the wiring board is bent, a break in wiring of the wiring board tends to be caused, and, as a result, reliability of the wiring board tends to be reduced.

SUMMARY OF THE INVENTION

An object of the present invention is to provide a wiring board and an electronic device using the same which respond to a demand for improving reliability.

A wiring board of the present invention includes an insulating board; a first pad provided inwardly from a surface of the insulating board and electrically connected to an electrode of an electronic component; a second pad provided on the surface of the insulating board and electrically connected to a lead terminal. The first pad and the second pad include a first layer region made of copper and a second layer region arranged on the first layer region and made of nickel, and a thickness of the second layer region of the second pad is larger than a thickness of the second layer region of the first pad.

An electronic device of the present invention includes the wiring board; an electronic component including an electrode electrically connected to the first pad of the wiring board; and a lead terminal electrically connected to the second pad of the wiring board.

According to the wiring board of the present invention, a thickness of the second layer region of the second pad is larger than a thickness of the second layer region of the first pad. As a result, the thickness of the second layer region of the second pad made of hard nickel can be made larger. With this arrangement, bending of the second pad is suppressed, so that bending stress reaching the wiring board from the lead terminal through the second pad can be reduced. Consequently, according to the present invention, it is possible to suppress the bending of wiring board, and eventually obtain the wiring board having excellent reliability.

The electronic device of the present invention includes the wiring board as described above, and therefore has excellent reliability.

DETAILED DESCRIPTION OF EXEMPLARY EMBODIMENTS

Hereinafter, an electronic device using a wiring board according to one embodiment of the present invention will be described in detail with reference to the drawings.

An electronic device 1 illustrated in FIGS. 1(a) and 1(b) is used in electronic apparatuses such as various types of audio visual devices, household electric appliances, communication devices, computer devices, inspection devices, or peripheral devices thereof. The electronic device 1 includes an electronic component 2, a lead terminal 3, and a wiring board 4 to which the electronic component 2 and the lead terminal 3 are connected.

The electronic component 2 is a semiconductor element such as a CPU, a memory, or a solid-state image sensing device. One electronic component 2 may be mounted on the wiring board 4, or a plurality of electronic components 2 may be mounted on the wiring board 4.

Figure 2:
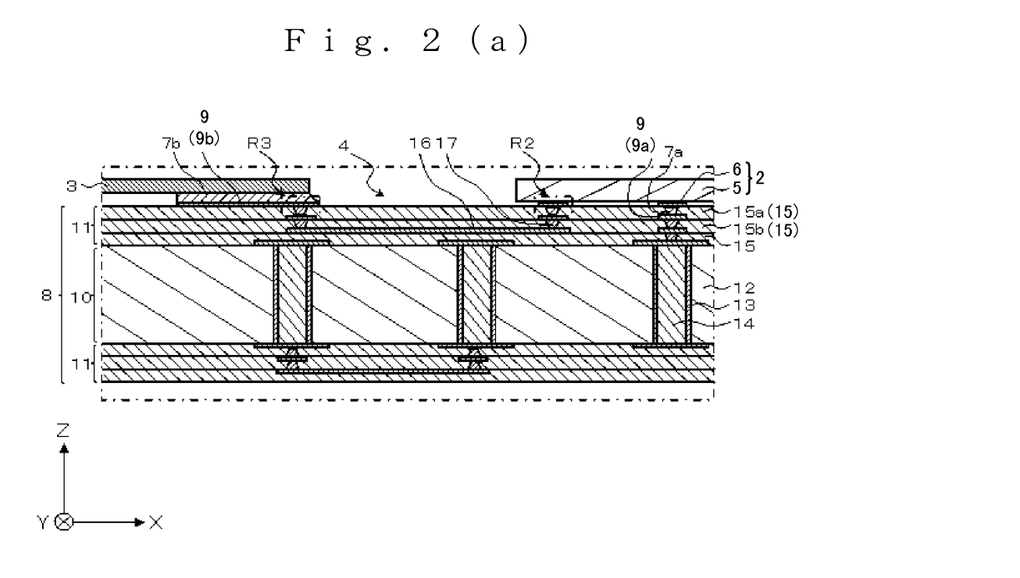
FIG. 2(a) is an enlarged view of a portion R1 of the electronic device 1 illustrated in FIG. 1(b)
FIG. 2(b) is a top view of a first pad 9a of the electronic device 1 illustrated in FIG. 2(a)
FIG. 2(c) is a top view of a second pad 9b of the electronic device 1 illustrated in FIG. 2(a)

As illustrated in FIG. 2(a), the electronic component 2 includes a semiconductor substrate 5 and electrodes 6 formed on the semiconductor substrate 5. The semiconductor substrate 5 functions as a semiconductor element, and may be made of a semiconductor material such as silicon, germanium, gallium arsenide, gallium arsenide phosphide, gallium nitride, or silicon carbide. The electrodes 6 function as terminals for electrically connecting to internal wiring of the semiconductor substrate 5, and may be made of a conductive material such as copper, gold, aluminum, nickel, or chrome. The electrodes 6 may be formed of a single layer, or may be formed by laminating a plurality of layers having different compositions.

Further, the electronic component 2 has a coefficient of thermal expansion in each direction thereof which is set, for example, to 3 ppm/° C. or larger and 5 ppm/° C. or smaller. The coefficient of thermal expansion of the electronic component 2 is measured according to the measurement method complying with JISK7197-1991 using a commercially available TMA apparatus. Hereinafter, the coefficient of thermal expansion of each member is measured in the same manner as that applied to the electronic component 2.

This electronic component 2 is mounted by flip chip bonding on the wiring board 4 through first solder 7a. Since the electronic component 2 is mounted by flip chip bonding in this way, the electrodes 6 can be arranged in a grid pattern so that the electrodes 6 can be densely arranged in comparison with a case of wire bonding mounting. The first solder 7a is to be electrically connected to the electrode 6, and can be made of a conductive material such as lead, tin, silver, gold, copper, zinc, bismuth, indium, or aluminum.

The lead terminal 3 is for electrically connecting the wiring board 4 to an external circuit (not illustrated). The lead terminal 3 is formed of, for example, a metal plate having an elongated shape as illustrated in FIGS. 1(a) and 1(b). A plate material made of a conductive material such as copper, a copper alloy, nickel, or a nickel alloy with plating of nickel, palladium, or gold can be used as the metal plate. The lead terminal 3 may be a part of a flexible board, or a part of a lead frame.

The lead terminal 3 is connected to the wiring board 4 through second solder 7b. The second solder 7b is to be electrically connected to the lead terminal 3, and can be made of a conductive material such as lead, tin, silver, gold, copper, zinc, bismuth, indium, or aluminum.

The wiring board 4 is for electrically connecting the electronic component 2 and the lead terminal 3 to each other. The wiring board 4 includes an insulating board 8 and a plurality of pads 9. The insulating board 8 includes a core substrate 10 and a pair of built-up layers 11 formed individually on two principal surfaces of the core substrate 10.

Figure 8:
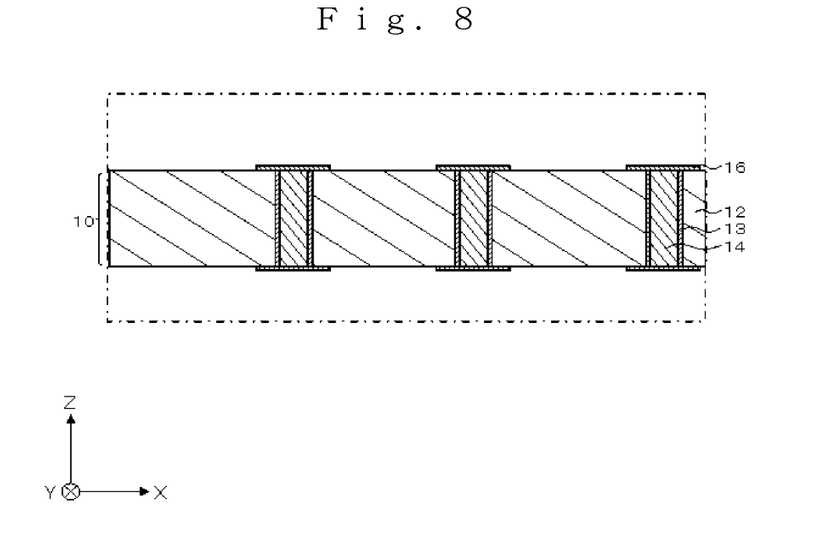
FIG. 8 is an enlarged view of a core substrate 10 used for preparing the wiring board 4 illustrated in FIG. 5.

The core substrate 10 is purposed for increasing the strength of the wiring board 4. The core substrate 10 includes a plate-shaped base body 12, a cylindrical through-hole conductor 13 that penetrates through the base body 12 in a thickness direction thereof, and a columnar insulator 14 arranged inside the through-hole conductor 13.

The base body 12 forms a principal portion of the core substrate 10 to enhance the rigidity thereof. The base body 12 includes a resin such as epoxy resin in which an inorganic insulating filler such as silica filler is dispersed, and a base material such as glass cloth coated by the resin. The base body 12 has a coefficient of thermal expansion in a planar direction thereof set, for example, to 5 ppm/° C. or more and 30 ppm/° C. or less, a coefficient of thermal expansion in a thickness direction thereof set, for example, to 15 ppm/° C. or more and 50 ppm/° C. or less, and a Young's modulus thereof set, for example, to 5 GPa or more and 30 GPa or less. The Young's modulus of the base body 12 is measured using Nano Indenter XP/DCM manufactured by MTS Systems Co. Hereinafter, the Young's modulus of each member is measured in the same manner as that applied to the base body 12.

The through-hole conductor 13 is to electrically connect the built-up layers 11 formed individually on the two principal surfaces of the core substrate 10 to each other, and is formed of, for example, copper which is a conductive material having high conductivity.

The insulator 14 is to form a support surface for supporting a via conductor 17 which will be describe later, and may be formed of a resin material such as epoxy resin.

In addition, the pair of built-up layers 11 are formed individually on the two principal surfaces of the core substrate 10, as described above. As illustrated in FIG. 2(a), each of the built-up layers 11 includes a plurality of insulating layers 15, a plurality of conductive layers 16 arranged partially on the base body 12 and the insulating layer 15, and a via conductor 17 which penetrates through the insulating layer 15 in a thickness direction thereof and is connected to the conductive layer 16.

The insulating layers 15 not only function as a support member for supporting the conductive layers 16 but also function as insulating members that prevent a short circuit between the conductive layers 16. For the sake of convenience, the insulating layer 15 arranged at an uppermost layer (a side of a region on which the electronic component 2 is mounted) among the plurality of insulating layers 15 is to be a first insulating layer 15a, and the insulating layer 15 arranged below the first insulating layer 15a (a side opposite to the region in which the electronic component 2 is mounted) and adjacent to the first insulating layer 15a is to be a second insulating layer 15b.

A through-hole P penetrating through the first insulating layer 15a in a thickness direction thereof is formed in the first insulating layer 15a, and the first solder 7a is arranged in the through-hole P. This through-hole P has a tapered shape whose upper and lower surfaces are circular and whose diameter becomes smaller toward the core substrate 10.

Figure 3:
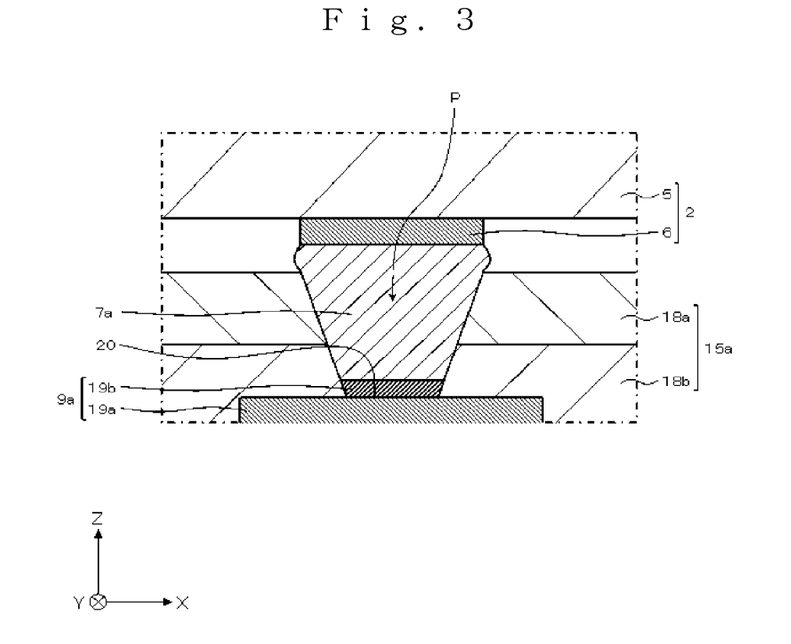
FIG. 3 is an enlarged view of a portion R2 of the electronic device 1 illustrated in FIG. 2(a)
Figure 4:
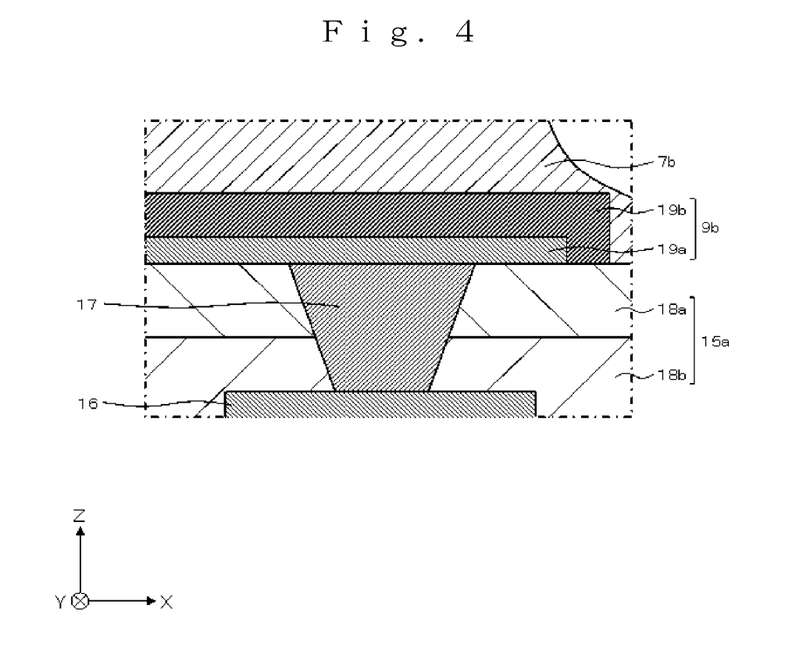
FIG. 4 is an enlarged view of a portion R3 of the electronic device 1 illustrated in FIG. 2(a)

As illustrated in FIGS. 3 and 4, the insulating layer 15 is formed of a first resin layer 18a, and a second resin layer 18b which is arranged closer to the core substrate 10 than the first resin layer 18a is.

The first resin layer 18a is to increase the rigidity of the insulating layer 15 and reduce a coefficient of thermal expansion in a planar direction, and includes a resin in which an inorganic insulating filler such as silica is dispersed. The first resin layer 18a has a coefficient of thermal expansion in a planar direction thereof set, for example, to 0 ppm/° C. or more and 30 ppm/° C. or less, a coefficient of thermal expansion in a thickness direction thereof set, for example, to 20 ppm/° C. or more and 50 ppm/° C. or less, and a Young's modulus thereof set, for example, to 2.5 GPa or more and 10 GPa or less. In addition, the first resin layer 18a has the Young's modulus higher than that of the second resin layer 18b, and the coefficient of thermal expansion in a planar direction smaller than that of the second resin layer 18b.

Examples of a resin contained in the first resin layer 18a include polyimide resin or the like. In view of reducing the coefficient of thermal expansion in a planar direction, such a resin is preferable in a film form having a structure in which a longer direction of each molecular chain is parallel to a planar direction of the first resin layer 18a.

The second resin layer 18b includes a resin, adheres to the first resin layers 18a adjacent in a thickness direction to each other, and is adhered to a side surface and one principal surface of the conductive layer 16 to fix the conductive layer 16. Although it is preferable that the second resin layer 18b include no inorganic insulating filler in view of adhesiveness, it may include the inorganic insulating filler. The second resin layer 18b has a coefficient of thermal expansion in a planar direction and a thickness direction thereof set, for example, to 10 ppm/° C. or more and 100 ppm/° C. or less, and a Young's modulus thereof set, for example, to 0.05 GPa or more and 0.5 GPa or less.

Examples of a resin contained that is included in the second resin layer 18b include epoxy resin, bismaleimide triazine resin, cyanate resin, amide resin, or the like.

The conductive layer 16 functions partially as a ground wire, a power supply wire, or a signal wire, and can be formed of, for example, copper which is a conductive material having high conductivity. It is preferable that the conductive layer 16 adhere to the first resin layer 18a through a metal layer made of titanium, molybdenum, chrome, or a nickel-chromium alloy. As a result, adhesion strength between the conductive layer 16 and the resin layer 18a can be increased.

The via conductor 17 is to connect the conductive layers 16 to each other which are separated from each other in a thickness direction, and can be formed of, for example, copper which is a conductive material having high conductivity. It is preferable that the via conductor 17 adhere to the insulating layer 15 through the metal layer described above, as in the case of the conductive layer 16. The via conductor 17 has a tapered shape whose diameter becomes smaller toward the core substrate 10.

The pad 9 functions as a terminal to electrically connect the wiring (through-hole conductor 13, conductive layer 16, and via conductor 17) of the wiring board 4 externally. The pad 9 includes a first layer region 19a made of copper, and a second layer region 19b made of nickel and arranged on the first layer region 19a. The first layer region 19a is to be connected to the conductive layer 16 or the via conductor 17 and is formed of copper as in the case of the conductive layer 16 or the via conductor 17. The second layer region 19b covers at least part of a surface of the first layer region 19a, and functions as a barrier layer of the first layer region 19a. Specifically, the second layer region 19b prevents the first layer region 19a from diffusing into the first solder 7a or the second solder 7b.

Figure 5:
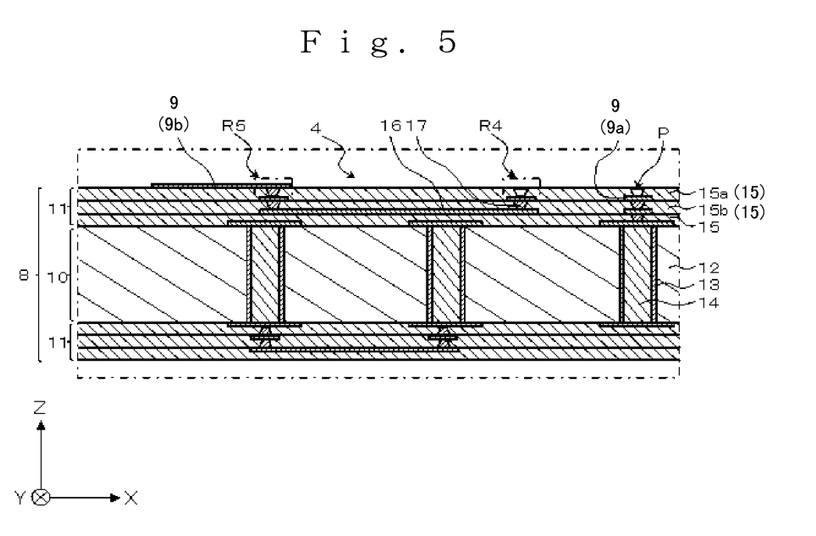
FIG. 5 is an enlarged view of a wiring board 4 illustrated in FIG. 2(a) in a state before connecting an electronic component 2 and a lead terminal 3.
Figure 6:
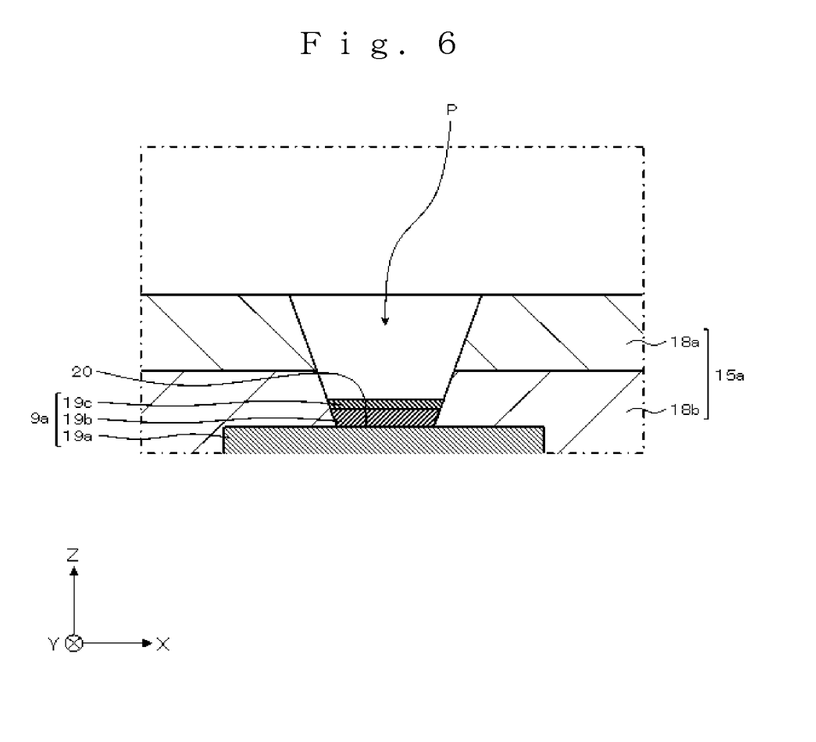
FIG. 6 is an enlarged view of a portion R4 of the wiring board 4 illustrated in FIG. 5.
Figure 7:
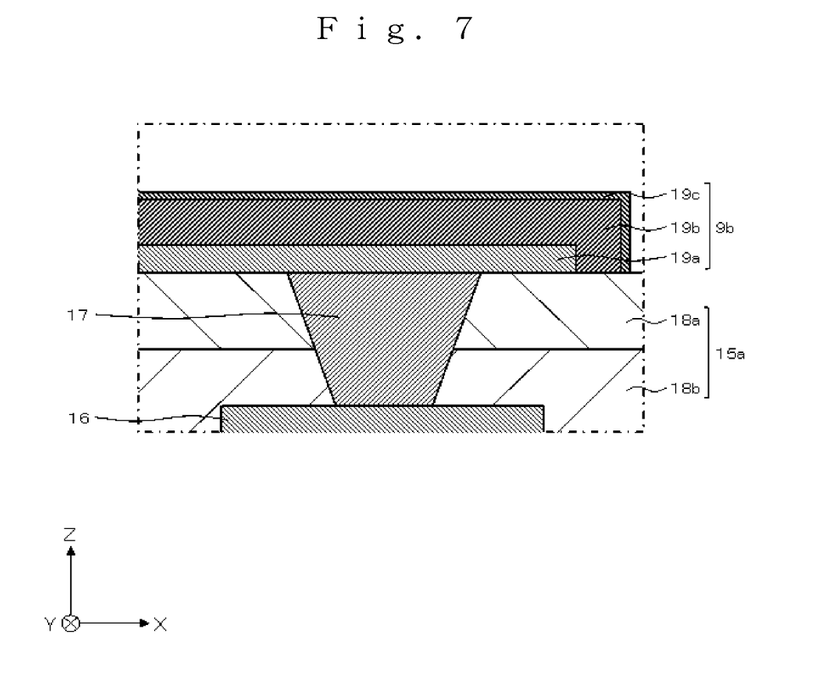
FIG. 7 is an enlarged view of a portion R5 of the wiring board 4 illustrated in FIG. 5.

As illustrated in FIGS. 5 to 7, before the electronic component 2 and the lead terminal 3 are connected to the wiring board 4, the pad 9 further includes a third layer region 19c which is arranged on the second layer region 19b and made of gold. The third layer region 19c covers a surface of the second layer region 19b, and suppresses oxidation of the second layer region 19b, and facilitates wettability between the second layer region 19b, and the first solder 7a or the second solder 7b. When the electronic component 2 and the lead terminal 3 are connected to the wiring board 4, the third layer region 19c disappears by being diffused into the first solder 7a or the second solder 7b.

Among the plurality of pads 9, at least one pad 9 is a first pad 9a that is electrically connected to the electrode 6 of the electronic component 2 through the first solder 7a. This first pad 9a is formed on the second insulating layer 15b that is arranged at the second position from the top (a region on which the electronic component 2 is mounted). A part of the first pad 9a is arranged and exposed in the through-hole P penetrating through the uppermost first insulating layer 15a, and is connected to the first solder 7a in the through-hole P.

Specifically, the first layer region 19a of the first pad 9a is arranged between the first insulating layer 15a and the second insulating layer 15b, and the second layer region 19b of the first pad 9a is arranged in an exposed portion (exposed portion 20) in the through-hole P. As illustrated in FIG. 6, before the first solder 7a is connected to the first pad 9a, the third layer region 19c of the first pad 9a covers an upper surface of the second layer region 19b in the through-hole P. As illustrated in FIG. 2(b), the first pad 9a is circular in plan view.

At least one pad 9 among the plurality of pads 9 is a second pad 9b which is electrically connected to the lead terminal 3 through the second solder 7b. The second pad 9b is arranged on the first insulating layer 15a which is positioned at the uppermost layer of the built-up layer 11. The second pad 9b is arranged on the insulating board 8, and an upper surface and side surfaces of the second pad 9b are connected to the second solder 7b.

The first layer region 19a of the second pad 9b is arranged on the first insulating layer 15a. The second layer region 19b of the second pad 9b covers an upper surface and side surfaces of the first layer region 19a of the second pad 9b. Before the second solder 7b is connected to the second pad 9b, the third layer region 19c of the second pad 9b covers an upper surface and side surfaces of the second layer region 19b of the second pad 9b. As illustrated in FIG. 2(c), the second pad 9b has a quadrangular shape, and preferably a rectangular shape in a plan view.

In FIG. 2(a), an end portion of the second pad 9b is not positioned immediately below the lead terminal 3, and the second solder 7b is in a fillet shape at the end portion of the second pad 9b.

Incidentally, for example, when the lead terminal 3 is connected to the wiring board 4, the lead terminal 3 is bent in some cases. When the lead terminal 3 is bent, bending stress applied to the lead terminal 3 reaches the wiring board 4 through the second pad 9b located in a connection portion between the lead terminal 3 and the wiring board 4, and the wiring board 4 becomes susceptible to bending. When the wiring board 4 is bent, a break in wiring of the wiring board 4 tends to be caused. Particularly, since deformation is caused in the via conductor 17 connected to the second pad 9b, a break in wiring between the via conductor 17 and the conductive layer 16 to which the via conductor 17 is connected tends to be caused.

According to the wiring board 4 of the present invention, a thickness of the second layer region 19b of the second pad 9b is larger than a thickness of the second layer region 19b of the first pad 9a. As a result, bending of the second pad 9b itself is suppressed by thickening the second layer region 19b made of hard nickel, so that bending stress reaching the wiring board 4 from the lead terminal 3 by way of the second pad 9b can be reduced. Accordingly, it is possible to suppress the bending of wiring board 4, and increase the reliability of the wiring board 4.

In addition, film stress of the second layer region 19b is reduced by reducing the thickness of the second layer region 19b made of hard nickel in the first pad 9a, so that exfoliation between the first layer region 19a and the second layer region 19b can be reduced. Therefore, electrical reliability of the first pad 9a can be increased. As a result, it is possible to miniaturize the first pad 9a, and arrange the wiring board 4 to be compatible with a narrower pitch of the electrode 6 of the electronic component 2, while the electrical reliability of the first pad 9a is maintained.

As such a first pad 9a, it is preferable that a thickness of the second layer region 19b be smaller than a thickness of the first layer region 19a. As a result, the exfoliation between the first layer region 19a and the second layer region 19b can be satisfactorily reduced. As the second pad 9b, it is preferable that a thickness of the second layer region 19b be larger than a thickness of the first layer region 19a. As a result, bending of the wiring board 4 can be satisfactorily suppressed. In such a case, for example, the thickness of the first layer region 19a of the first pad 9a is set substantially to the same thickness (error thereof is about ±10%) as the thickness of the first layer region 19a of the second pad 9b.

The thickness of the first layer region 19a of the first pad 9a is preferably 3 to 8 µm, and the thickness of the second layer region 19b of the first pad 9a is preferably 3 to 5 µm. The thickness of the first layer region 19a of the second pad 9b is preferably 3 to 8 µm, and the thickness of the second layer region 19b of the second pad 9b is preferably 6 to 9 µm.

According to the wiring board 4 of the present invention, an upper surface of the first pad 9a is at least partially exposed in the through-hole P, and is connected to the first solder 7a arranged in the through-hole P. In this way, by arranging the first solder 7a in the through-hole P of the first insulating layer 15a, it is possible to suppress a short circuit between the adjacent first solders 7a, and eventually arrange the wiring board 4 to be compatible with a narrower pitch of the electrode 6 of the electronic component 2.

The first layer region 19a of the first pad 9a is arranged between the first insulating layer 15a and the second insulating layer 15b, and the second layer region 19b of the first pad 9a is arranged in the exposed portion 20 in the through-hole P. A corner portion between an inner wall of the through-hole P and a lower surface of the first insulating layer 15a is formed at a lower end of the through-hole P, and stress tends to be concentrated on the vicinity of the corner portion. For this reason, stress tends to concentrate on a connecting interface which is positioned in the vicinity of the corner portion and between the exposed portion 20 of the first layer region 19a and the second layer region 19b. However, according to the wiring board 4 of the present invention, since the thickness of the second layer region 19b of the first pad 9a is small as described above, this can reduce the film stress of the second layer region 19b, and the exfoliation between the exposed portion 20 of the first layer region 19a and the second layer region 19b can be satisfactorily reduced.

An area of the first pad 9a in plan view is smaller than an area of the second pad 9b in plan view. As a result, since the first pad 9a can be miniaturized, the wiring board 4 can be arranged to be compatible with a narrower pitch of the electrode 6 of the electronic component 2. Furthermore, as described above, since the thickness of the second layer region 19b of the first pad 9a is small, the first pad 9a can be miniaturized while the electrical reliability of the first pad 9a is maintained.

In contrast, the area of the second pad 9b in plan view is larger than the area of the first pad 9a in plan view. As a result, since an adhesion area between the second pad 9b and the second solder 7b is increased, the connecting strength between the second pad 9b and the lead terminal 3 can be increased.

Accordingly, the electronic device 1 described above provides a desired function by driving or controlling the electronic component 2 based on power and signals supplied through the wiring board 4 from the lead terminal 3 electrically connected to an external circuit.

Next, a description will be given of a method for manufacturing the electronic device 1 described above.

(1) As illustrated in FIG. 8, the core substrate 10 with the conductive layers 16 formed individually on two principal surfaces thereof is prepared as described below.

First, for example, the base body 12 is prepared by laminating a plurality of uncured resin sheets together, laminating a copper foil on an outermost layer, and heating, pressurizing, and thus curing the laminated body. Here, an uncured state is a state of A-stage or B-stage complying with ISO472:1999. Next, a through-hole penetrating through the base body 12 in a thickness direction thereof is formed, for example, by drilling, laser processing, or the like. Subsequently, the through-hole conductor 13 is formed by adhering a conductive material onto the inner wall of the through-hole by, for example, the non-electroplating method and the electroplating method. Then, the insulator 14 is formed by filling a resin or the like in the through-hole conductor 13. Thereafter, after the conductive material is adhered to the exposed portion of the insulator 14, the copper foil is subjected to patterning by a conventionally well-known photolithography technique, etching method, or the like to thereby form the conductive layer 16.

(2) A pair of built-up layers 11 are formed individually on two principal surfaces of the core substrate 10, and the wiring board 4 illustrated in FIG. 5 will be prepared as, for example, described below.

First, the first resin layer 18a is placed on the core substrate 10 through the second resin layer 18b which is uncured, and thereafter the second resin layer 18b is cured by heating and pressurizing the core substrate 10, the second resin layer 18b, and the first resin layer 18a, so that the insulating layer 15 is formed on the core substrate 10. Next, via holes are formed at desired positions in the insulating layer 15 by laser processing using, for example, the YAG laser device or the carbon dioxide laser device, so that at least part of the conductive layer 16 is exposed in the via hole. Then, a metal film is formed as an underlayer on the insulating layer 15 and on the inner surface of the via hole using the sputtering method. Subsequently, a resist which is patterned in a desired shape is formed on the metal film using the photolithography technique, and thereafter the conductive layer 16 and the via conductor 17 are formed partially on the metal film. Then, after the resist is removed from the metal film, a region where the conductive layer in the metal film is not formed is removed using etching.

The above-mentioned steps are repeated to form the pair of built-up layers 11, and then the insulating board 8 can be prepared.

Next, a method for forming the first pad 9a will be described in detail.

First, when the first pad 9a is formed on the second insulating layer 15b, the first layer region 19a is formed on the second insulating layer 15b as in the case of the conductive layer 16. Next, after the first insulating layer 15a is formed on the second insulating layer 15b, when the via hole is formed in the first insulating layer 15a, a through-hole P is formed using laser processing as in the case of forming the via hole, an upper surface of the first layer region 19a is partially exposed in the through-hole P, and the exposed portion 20 is formed. Subsequently, the second layer region 19b and the third layer region 19c are sequentially adhered to the exposed portion 20 in the through-hole P using the non-electroplating method, so that the first pad 9a can be formed.

Next, a method for forming the second pad 9b will be described in detail.

First, when the conductive layer 16 is formed on the first insulating layer 15a, the first layer region 19a is formed on the first insulating layer 15a as in the case of the conductive layer 16. Next, simultaneously with adhering the second layer region 19b and the third layer region 19c in the first pad 9a, the second layer region 19b and the third layer region 19c are sequentially adhered to the first layer region 19a of the second pad 9b using the non-electroplating method. In this way, the second pad 9b can be formed.

Here, the thickness of the second layer region 19b of the first pad 9a and the thickness of the second layer region 19b of the second pad 9b can be adjusted, for example, in the following manner.

As described above, the first pad 9a is provided in the through-hole P, and, for example, a plate for blocking a flow of a plating solution is arranged in the vicinity of the through-hole P, an inflow of the plating solution into the through-hole P can be suppressed. As a result, the thickness of the second layer region 19b of the first pad 9a can be made smaller than the thickness of the second layer region 19b of the second pad 9b.

Alternatively, this can be adjusted in the following manner. After masking the through-hole P, the second layer region 19b is adhered to the first layer region 19a of the second pad 9b using the non-electroplating. Next, after the mask for the through-hole P is removed, the second layer region 19b is adhered to the first layer region 19a of each of the first pad 9a and the second pad 9b using the non-electroplating. In this way, the thickness of the second layer region 19b of the second pad 9b is made larger than the thickness of the second layer region 19b of the first pad 9a.

Figure 1:
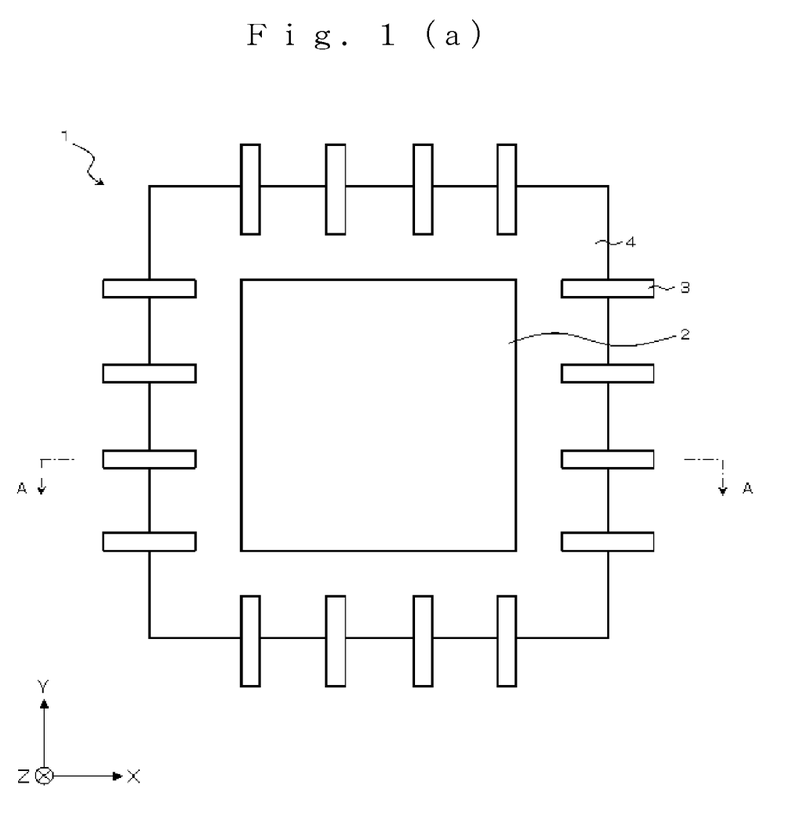
FIG. 1(a) is a top view of an electronic device 1 according to one embodiment of the present invention.
FIG. 1(b) is a cross sectional view of the electronic device 1 taken along a line A-A of the electronic device 1 illustrated in FIG. 1(a) in a thickness direction thereof.

(3) The electronic component 2 and the lead terminal 3 are connected to the wiring board 4, and the electronic device 1 illustrated in FIGS. 1 and 2(a) is prepared, for example, in the following manner.

First, the electronic component 2 in which the first solder 7a is adhered to the electrode 6, and the lead terminal 3 to which the second solder 7b is adhered are prepared. Next, the first solder 7a which is adhered to the electrode 6 of the electronic component 2 is arranged in the through-hole P, and the second solder 7b adhered to the lead terminal 3 is arranged on the second pad 9b. Subsequently, by applying heat (solder reflow) at a temperature at which the first solder 7a and the second solder 7b melt, the first solder 7a is filled into the through-hole P so that the first solder 7a is connected to the first pad 9a, and the second solder 7b is connected to the second pad 9b. During this process, the third layer region 19c is dispersed into the first solder 7a and the second solder 7b.

As described above, the electronic device 1 can be prepared.

The present invention is not limited to the embodiment described above, and various modifications, improvements, combinations, and the like may be made without departing from the spirits and the scope of the present invention.

For example, in the embodiment described above, although an example in which the built-up layer is formed of three layers of insulating layers is described, the insulating layer may not be formed of three layers.

Also, in the embodiment described above, although an example in which the insulating layer includes the first resin layer and the second resin layer is described, the insulating layer may be formed of the second resin layer alone.

What is claimed is:

1. A wiring board comprising:
    an insulating board for mounting an electronic component on a surface thereof, the insulating board including a first insulating layer having a through-hole positioned at an uppermost layer and a second insulating layer positioned in close proximity to the first insulating layer below the first insulating layer;
    a first pad provided on the second insulating layer and having an upper surface which is at least partially exposed in the through-hole and electrically connected to an electrode provided on a surface of the electronic component;
    a second pad provided on the first insulating layer excluding the through hole and electrically connected to a lead terminal to be connected to an external circuit,
    wherein the first pad and the second pad include a first layer region made of copper, and a second layer region arranged on the first layer region and made of nickel, and
    a thickness of the second layer region of the second pad is larger than a thickness of the second layer region of the first pad.

2. The wiring board according to claim 1,
    wherein the first layer region of the first pad is arranged between the first insulating layer and the second insulating layer, and
    the second layer region of the first pad is arranged on an exposed portion of the first layer region which is exposed in the through-hole.

3. The wiring board according to claim 1,
    wherein solder is arranged in the through-hole, and
    the electrode of the electronic component and the first pad are electrically connected to each other through the solder.

4. The wiring board according to claim 1,
    wherein the second layer region of the second pad covers an upper surface and a side surface of the first layer region of the second pad.

5. The wiring board according to claim 1,
    wherein an area of the first pad in plan view is smaller than an area of the second pad in plan view.

6. The wiring board according to claim 1,
    wherein a thickness of the first layer region of the first pad is larger than the thickness of the second layer region of the first pad, and
    a thickness of the first layer region of the second pad is smaller than the thickness of the second layer region of the second pad.

7. The wiring board according to claim 1,
    wherein the thickness of the first layer region of the first pad is identical with the thickness of the first layer region of the second pad.

8. An electronic device comprising:
    the wiring board according to claim 1;
    an electronic component including an electrode electrically connected to the first pad of the wiring board; and
    a lead terminal electrically connected to the second pad of the wiring board.

* * * * *